United States Patent
Fattaruso

(10) Patent No.: US 6,348,391 B1
(45) Date of Patent: Feb. 19, 2002

(54) MONOLITHIC INDUCTOR WITH GUARD RINGS

(75) Inventor: John W. Fattaruso, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/559,907

(22) Filed: Apr. 26, 2000

Related U.S. Application Data

(62) Division of application No. 09/140,255, filed on Aug. 26, 1998, now Pat. No. 6,160,303.
(60) Provisional application No. 60/057,406, filed on Aug. 29, 1997.

(51) Int. Cl.[7] .................. H01L 21/20; H01L 21/8244; H01L 21/8222
(52) U.S. Cl. .................. 438/381; 438/238; 438/329
(58) Field of Search .................. 438/381, 238, 438/901, 329, 171; 257/531, 532, 533; 336/200, 232

(56) References Cited

U.S. PATENT DOCUMENTS

| | | | | |
|---|---|---|---|---|
| 5,481,131 A | * | 1/1996 | Staudinger et al. | 257/531 |
| 5,656,849 A | * | 8/1997 | Burghartz et al. | 257/528 |
| 5,805,043 A | * | 9/1998 | Bahl | 336/200 |
| 5,884,990 A | * | 3/1999 | Burghartz et al. | 336/200 |

FOREIGN PATENT DOCUMENTS

JP 09260587 * 10/1997 .......... H01L/27/04

* cited by examiner

Primary Examiner—Trung Dang
Assistant Examiner—Brook Kebede
(74) Attorney, Agent, or Firm—Warren L. Franz; Wade James Brady III; Frederick J. Telecky, Jr.

(57) ABSTRACT

An integrated circuit and method of fabrication are disclosed for achieving electrical isolation between a spiral inductor and an underlying silicon substrate using standard semiconductor manufacturing process flow. A spiral conductor with square windings is formed in metal layer (20) patterned so that straight runs of successive turns (22, 23, 24) overlie corresponding runs of concentric square rings (16, 17, 18) formed in underlying metal layer (14). A unity gain voltage buffer (30) connects each ring (16, 17, 18) with a respective overlying turn (22, 23, 24).

4 Claims, 4 Drawing Sheets

MONOLITHIC INDUCTOR WITH GUARD RINGS

CROSS REFERENCE TO PRIOR APPLICATIONS

This application is a division of Ser. No. 09/140,255, filed Aug. 26, 1998, now U.S. Pat. No. 6,160,303 which claims priority under 35 U.S.C. 119(e) based upon Provisional Application Serial No. 60/057,406, filed Aug. 29, 1997.

This invention relates to fabricating inductors in silicon substrates, and in particular to fabricating spiral inductors in monolithic circuits such as radio frequency (RF) wireless communication circuits.

BACKGROUND OF THE INVENTION

Interest in fabricating monolithic RF amplifiers in silicon has been prompted by interest in miniaturization of circuits for use in cellular telephones, wireless modems and other types of equipment, especially in high frequency bands such as the 1-GHz band. However, a major limitation in making use of large spiral inductors in monolithic circuits is the low frequency and low-Q self-resonance caused by distributed capacitance to the conductive silicon substrate. One way to avoid this limitation is by adding a process step to etch out the substrate underneath the inductor, thereby suspending the inductor over a pit in the substrate. This approach is described in U.S. Pat. No. 5,539,241 and J. Y-C. Chang and Asad Abidi, "Large Suspended Inductors on Silicon and Their Use in a 2-$\mu$m CMOS RF Amplifier," *IEEE Electron Device Letters*, Vol. 14, No. 5, May 1993, page 246–248, both of which are incorporated in their entireties by reference herein. There is a need for achieving the same isolation in a standard semiconductor manufacturing process flow.

SUMMARY OF THE INVENTION

The invention provides a method for achieving electrical isolation between a spiral inductor and an underlying silicon substrate, usable in a standard semiconductor manufacturing process flow. The invention further provides monolithic inductor circuits utilizing such method.

In accordance with one aspect of the invention, metal 1 guard rings are placed under the spiral turns of an inductor and driven with voltage buffers connected to the inductor metal at several places. This electronically reduces to an insignificant level the effective capacitance to the substrate seen by the inductor. In another aspect of the invention, output resistance is used at the voltage buffers to produce a high-Q resonator. The invention enables practical inductors formed with standard BiCMOS processes to be used in monolithic silicon RF circuits in the range of approximately 500 MHz–2 GHz.

BRIEF DESCRIPTION OF THE DRAWINGS

Embodiments of the invention have been chosen for purposes of illustration, and are described with reference to the accompanying drawings, wherein.

Throughout the drawings, like numerals refer to like elements.

DETAILED DESCRIPTION OF PREFERRED EMBODIMENTS

Figure 1:
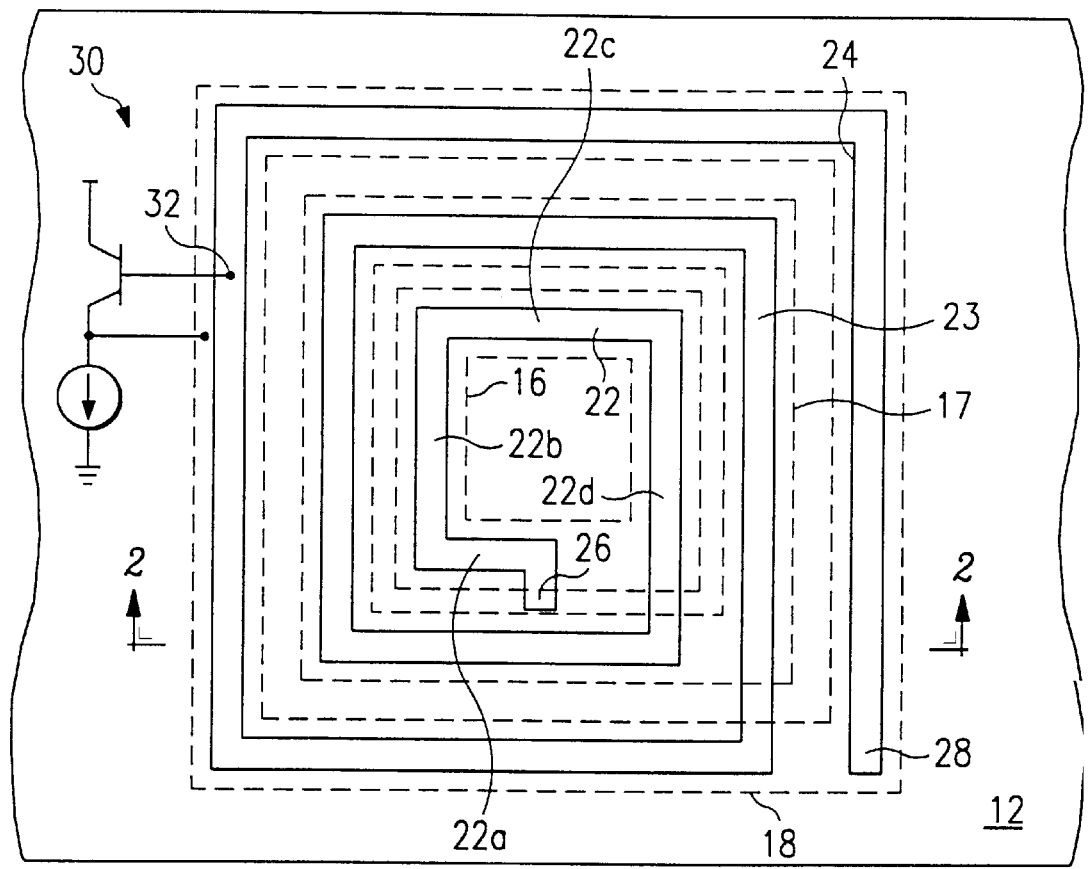
FIG. 1 is a partially schematic top plan view of an embodiment of a monolithic circuit including an integrated spiral inductor in accordance with the principles of the invention.
Figure 2:
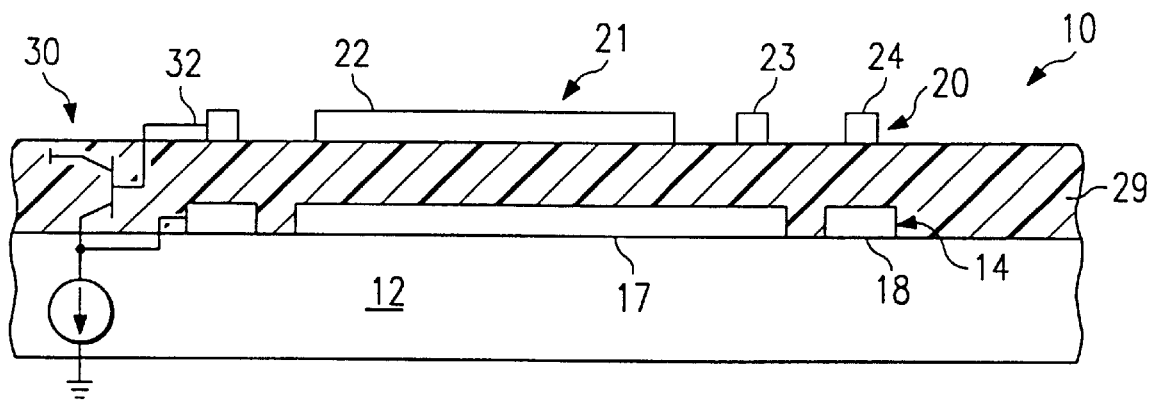
FIG. 2 is a partially schematic section view taken along the line 2—2 of FIG. 1.

A feasible method of fabricating an inductor in a silicon substrate for inclusion in a monolithic circuit is a spiral of square windings in a metal layer, as shown in FIGS. 1 and 2.

FIG. 1 illustrates a circuit including an inductor monolithically integrated in a semiconductor die 10 along with other circuit components. Die 10 is comprised of a semiconductor substrate 12 such as, for example, gallium arsenide, silicon, germanium, or the like. A first layer of conductive material, metal1 layer 14, is formed on the substrate and patterned to form a series of planar concentric squares 16, 17, 18. The layer of conductive material 14 may be aluminum, titanium tungsten, gold, etc., by way of example, all having a thickness of approximately 1 $\mu$m and patterned to form rectangularly shaped closed ring structures. For avoidance of eddy currents, it may be desirable to leave one or more breaks in the rings. A second layer of conductive material, metal2 layer 20, is formed on the substrate and patterned to form a planar spiral conductor 21 having successive inner to outer turns 22, 23, 24 with straight runs generally superposed and overlying corresponding runs of the metal1 layer squares 16, 17, 18. Spiral 21 has an inner terminal 26 and an outer terminal 28 for electrically interconnecting spiral 21 to other circuitry within the die 10. A layer of insulating material 29 separates and insulates the metal1 and metal2 layers.

Figure 3:
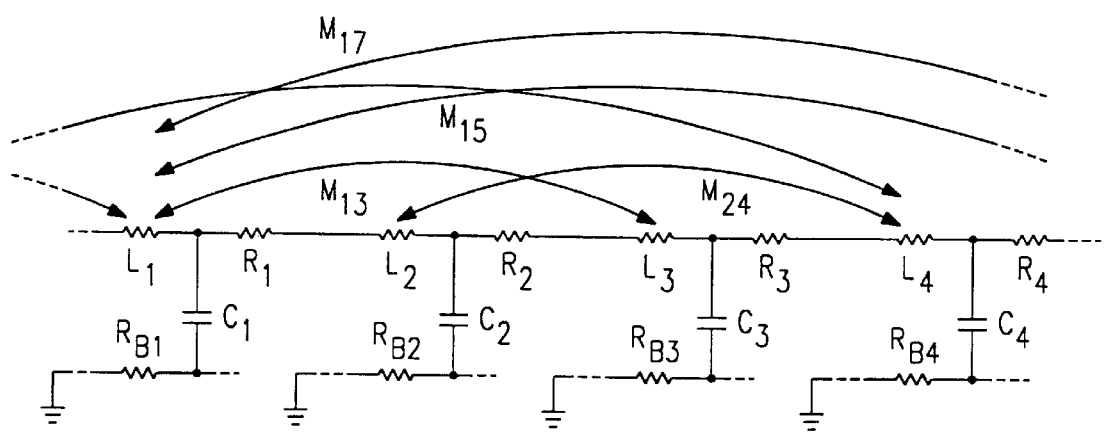
FIG. 3 is a circuit model for one turn of a spiral inductor on a conductive substrate.

An equivalent circuit model for an inductor such as spiral inductor 21, without the underlying metal1 layer 14, is shown in FIG. 3. For simplicity, the illustrated model corresponds to only one turn of the inductor. The model for the entire inductor may be completed by wiring a similar model for all the turns in series, and completing a matrix of mutual inductances. Each grouping of lumped circuit elements $L_i$, $R_i$, $C_i$ and $R_{Bi}$ in FIG. 3 represents the inductance, resistance, capacitance and bulk resistance, respectively, associated with a corresponding one of the straight-line segments 22a, 22b, 22c, 22d, etc. of the square spiral 20. For example, the inductance $L_i$ is the self-inductance of the ith segment. In addition, there is a mutual inductance to every other segment parallel to the segment being modeled. If the segments in the inductor are indexed from 1 for the first, outermost segment, up to 4n for the last, innermost segment, where n is the number of turns in the spiral, then segment i will have a non-zero mutual inductance to segment j if (i+j) is an even number. $M_{ij}$ will be negative if $|i-j|/2$ is an odd number, since current flow will be in opposite directions in $L_i$ and $L_j$. If $|i-j|/2$ is an even number, $M_{ij}$ will be positive. $R_i$ models the metal resistance in each segment, and $C_i$ models the capacitance from each segment to the substrate.

$R_{Bi}$ models the resistance in the bulk, sideways to the next outer turn. Therefore, bulk resistor $R_{Bi}$ connects the bottom plate of capacitor $C_i$ with the bottom plate of $C_{i-4}$, for i>4. For i≦4, $R_{Bi}$ is assumed to connect the bottom plate of $C_i$ with a grounded substrate contact.

Figure 4:
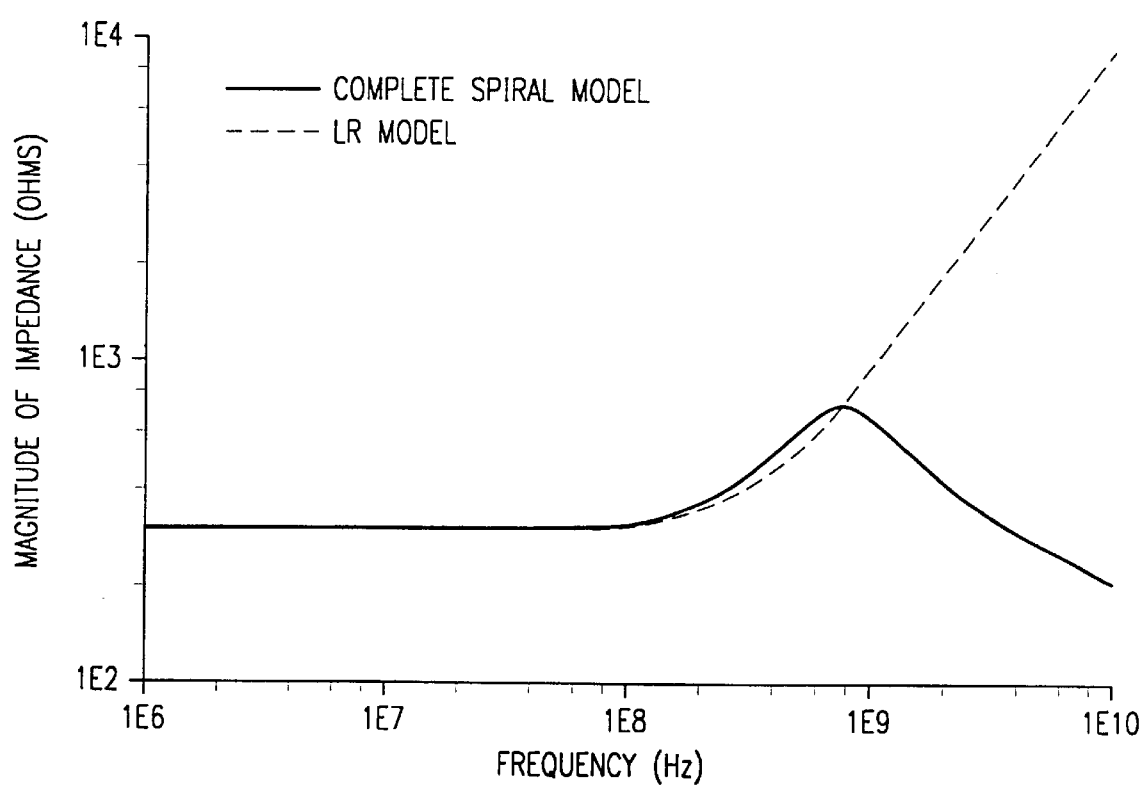
FIG. 4 is a graph of SPICE simulation results using the FIG. 3 model for an inductor without guard rings.

In the course of work on this invention, a computer program was written to generate a SPICE simulation file using this model, for an inductor of any number of turns and any geometry. FIG. 4 shows the results of a SPICE simulator that measures the impedance of a square spiral inductor having the fabrication process dimensions given in the Chang and Abidi reference. The dashed line in FIG. 4 represents the ideal impedance versus frequency of an isolated inductor with the same total inductance as that of the geometry of the Chang and Abidi reference (131 nH), along with a series resistance modeling the metal resistance in all segments (288 ohms). The solid line in FIG. 4 is the simulated impedance characteristic, and shows a low-Q self-resonance when the distributed capacitance to the conducting substrate is taken into account. This characteristic would not allow use of this inductor in a high-Q tank circuit or impedance transformation circuit in the frequency range of 800 MHz to 2 GHz. By etching away the substrate under the inductor, Chang and Abidi were able to raise the self-resonant frequency to about 3 GHz, and to eliminate the losses due to capacitance substrate coupling that is reflected as lower inductor Q. This invention provides electronic means to accomplish the same goal, as well as to exploit the particular geometries to build high-Q resonators on a monolithic circuit.

In accordance with an illustrative embodiment implementation of the invention, as shown in FIGS. 1 and 2, a metal ring 16, 17, 18 is placed under each inductor turn, or set of turns, 22, 23, 24, one level below the metal used in the inductor. The metal ring 16, 17, 18 is connected to the output of a unity gain voltage buffer 30, one per ring. The input 32 of each buffer 30 is connected to the end of some top metal inductor turn 22, 23, 24. The circuit model then takes the form shown in FIG. 5.

As before, there are the self-inductance of each segment $L_i$, the resistance of each metal segment $R_i$, the matrix of mutual inductances $M_{ij}$ and the bulk resistances $R_{Bi}$. Now, however, the substrate capacitance is split into two series capacitors: $C_{Ti}$, which is the top capacitance from the inductor segment to the guard ring, and $C_{Bi}$, which is the bottom capacitance from the guard ring to the substrate. The guard ring is driven by the voltage buffer 30, and in the example of FIG. 5, the buffer input for the ring under each turn is connected to the segment metal of that turn as well, although in general, some advantages may be realized by connecting the buffer to another segment in another turn.

Figure 5:
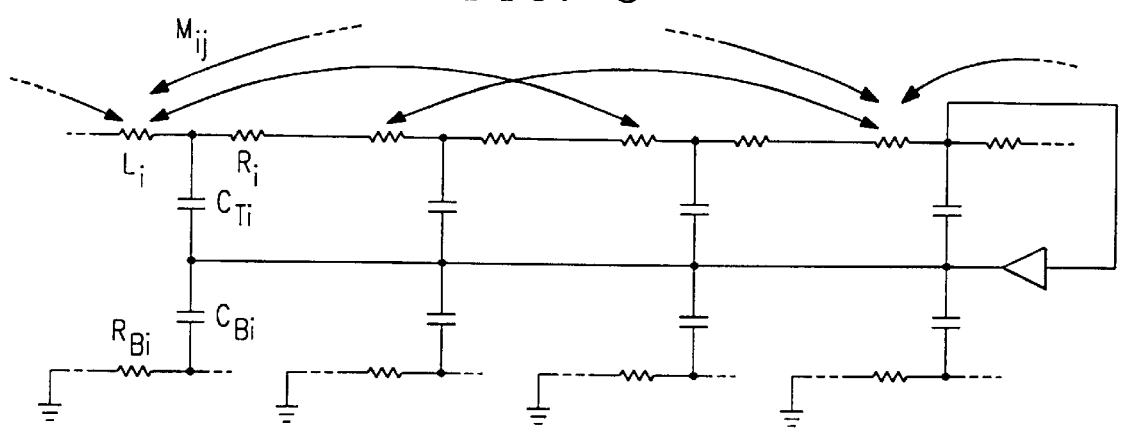
FIG. 5 is a circuit model for one turn of a spiral inductor including a guard ring and voltage buffer.
Figure 6:
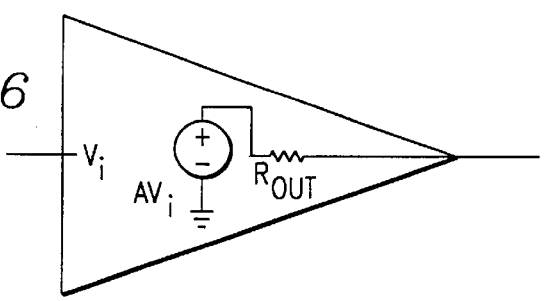
FIG. 6 is a schematic representation of an ideal buffer.
Figure 7:
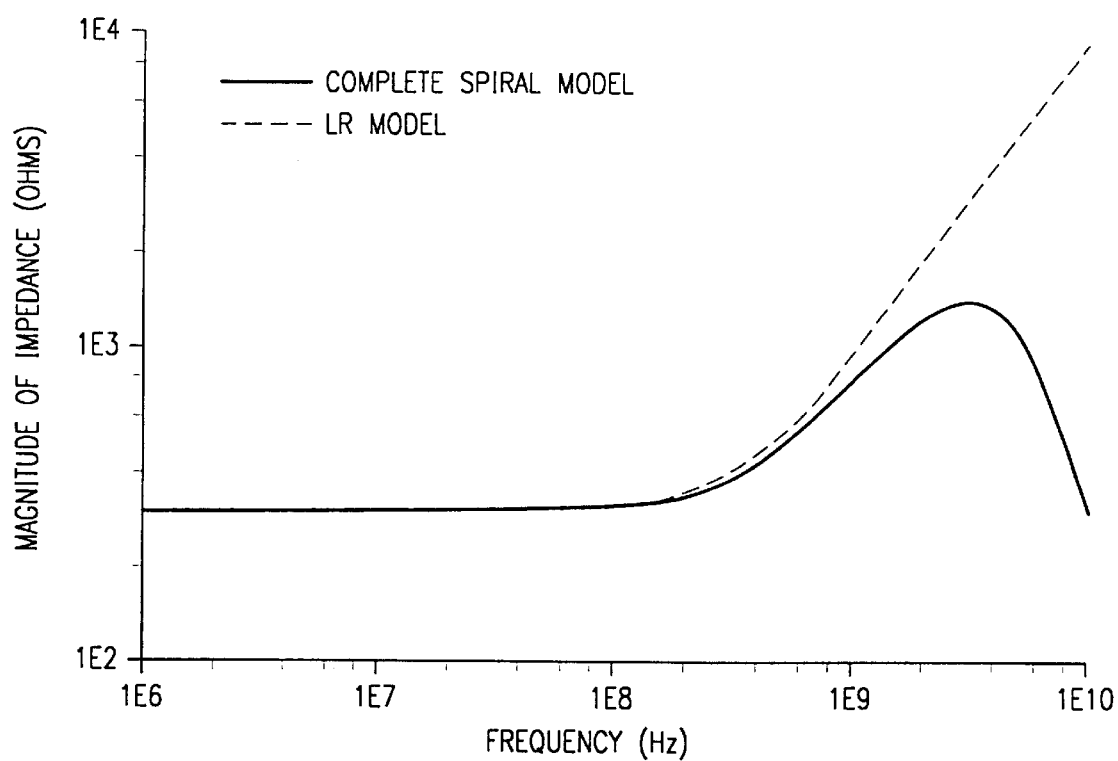
FIG. 7 is a graph of SPICE simulation results using the FIG. 6 buffer in the FIG. 5 inductor model.

The advantages of this arrangement can be appreciated from consideration of the effect of an ideal voltage buffer in the model of FIG. 5. The ideal buffer can be simulated with the equivalent circuit shown in FIG. 6, wherein A=1 and $R_{out}$=10 ohms. Then, the voltage across each of the top capacitors $C_{Ti}$ in the model of FIG. 5 will be forced to be very small, and the displacement current through them will be small. This implies there is very little distributed capacitive load on the inductor segments, leaving a more nearly ideal inductive impedance available to the circuit to which the spiral is connected. The results of SPICE simulations with this ideal buffer are shown in FIG. 7. Note that for frequency in the range of 500 MHz–2 GHz the impedance is primarily inductive, and that the self-resonance frequency has been raised to about 3 GHz with no additional etching of the substrate in the fabrication process. There are many concerns about manufacturability and reliability of Chang and Abidi's solution.

For the simulation of FIG. 7, 20 ideal buffers were used, driving guard rings under each of the 20 turns in the geometry of FIGS. 1 and 2. The buffer input was wired to the outermost segment of each turn.

Figure 8:
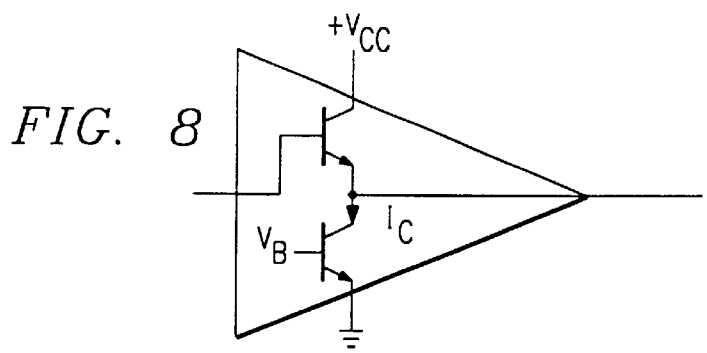
FIG. 8 is a schematic representation of an emitter-follower buffer.
Figure 9:
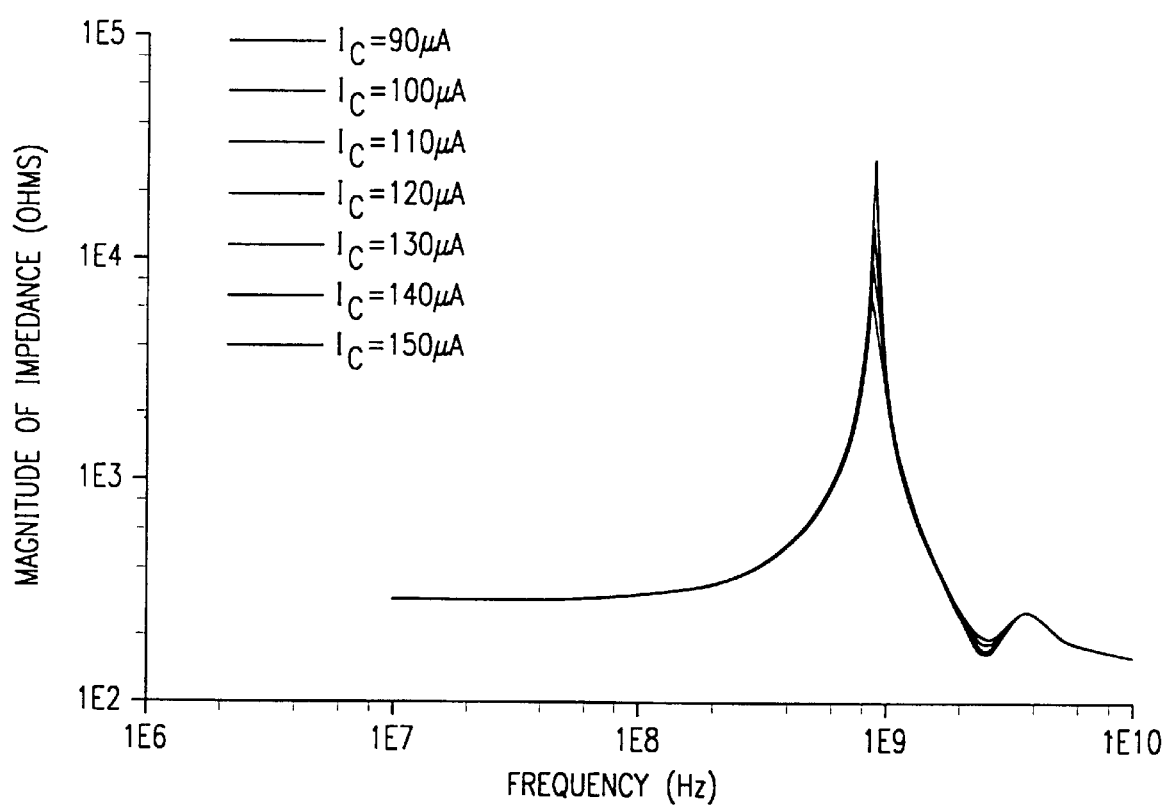
FIG. 9 is a graph of SPICE simulation results using the FIG. 8 buffer in the FIG. 5 inductor model.

To implement an inductor with guard rings in a monolithic circuit, it must be possible to realize a voltage buffer with low output resistance and low enough parasitic capacitance to leave the interlayer capacitance $C_{Ti}$ and $C_{Bi}$ the dominant capacitance in the system. Unfortunately, in some designs, it is not possible, with a maximum device $f_t$ of 15 GHz, to build a bipolar device with transconductance of 1/10 ohms and capacitance negligible relative to those of the geometry of FIGS. 1 and 2. However, if buffers of higher output impedance are used (which are easily possible with low capacitance), the effect on the spiral inductor is to employ the interlayer capacitance to realize a distributed LC resonator with much higher Q than that limited by inductor metal resistance. For example, if the voltage buffers are implemented as simple emitter-followers as shown in FIG. 8, then the simulated results of FIG. 9 are obtained. For this SPICE simulation, the collector current $I_c$ was varied from 900 µA to 150 µA in each of 10 buffers, with the buffers driving a guard ring that covers the area under two inductor turns. The input to each buffer was connected to the metal segment that is four segments to the outside of the first segment over the guard ring.

Note that the result is a very high-Q resonator that is useful in RF tuned amplifiers and impedance transformation networks. Varying the buffer bias current also varies the resonant frequency over a range, and therefore this circuit would be used as a tank circuit in a low-phase voice voltage controlled oscillator (VCO) circuit. This circuit may be fabricated in a standard BiCMOS process with no preferential etch needed to remove any underlying area of the substrate.

Those skilled in the art to which the invention relates will appreciate that substitutions, modifications and additions can be made to the foregoing embodiments, without departing from the spirit and scope of the invention as defined by the claims.

What is claimed is:

1. A method of fabricating an inductor monolithically integrated in a semiconductor die, comprising:

providing a semiconductor substrate;

forming a first layer of conductive material on the substrate;

patterning the first conductive layer to form a series of concentric rings;

forming a layer of insulating material on the substrate over the first conductive layer;

forming a second layer of conductive material on the substrate over the insulating layer;

patterning the second conductive layer to form a spiral conductor having successive turns generally superposed and overlying corresponding rings of the first conductive layer, so that at least one second layer turn overlies each first conductive layer ring; and forming a unity gain voltage buffer on the substrate associated with at least one ring, said buffer having an output connected to the associated ring and an input connected to an overlying turn.

2. The method of claim 1, wherein the buffers are formed as emitter-followers.

3. The method of claim 1, wherein the first conductive layer is patterned to form a series of rectangularly shaped closed rings with straight runs; and the second conductive layer is patterned to form a rectangular spiral conductor having successive inner to outer turns with straight runs generally superposed and overlying corresponding runs of the first conductor layer rings.

4. The method of claim 2, wherein each buffer has the output connected to a run of the associated ring and the input connected to a corresponding overlying run of the rectangular spiral conductor.

* * * * *